(12) United States Patent
Naijo

(10) Patent No.: US 9,099,414 B2
(45) Date of Patent: Aug. 4, 2015

(54) ORGANIC LIGHT EMITTING DIODE DISPLAY

(71) Applicant: Samsung Display Co., Ltd., Yongin, Gyeonggi-Do (KR)

(72) Inventor: Tsuyoshi Naijo, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/104,224

(22) Filed: Dec. 12, 2013

(65) Prior Publication Data

US 2015/0041766 A1 Feb. 12, 2015

(30) Foreign Application Priority Data

Aug. 8, 2013 (KR) .................. 10-2013-0094419

(51) Int. Cl.
*H01L 21/00* (2006.01)
*H01L 27/32* (2006.01)

(52) U.S. Cl.
CPC .................. *H01L 27/3244* (2013.01)

(58) Field of Classification Search
CPC .................................. H01L 27/3244
USPC .......................... 257/39–40; 345/1.3
See application file for complete search history.

(56) References Cited

U.S. PATENT DOCUMENTS

| | | | |
|---|---|---|---|
| 6,377,324 B1 | 4/2002 | Katsura | |
| 7,033,911 B2 * | 4/2006 | Manepalli et al. | 438/455 |
| 7,460,085 B2 * | 12/2008 | Ishii | 345/1.1 |
| 7,777,856 B2 * | 8/2010 | Silverbrook | 349/150 |
| 8,237,165 B2 * | 8/2012 | Kim et al. | 257/59 |
| 8,305,743 B2 | 11/2012 | Wu et al. | |
| 8,461,756 B2 * | 6/2013 | Sakai et al. | 313/502 |
| 2006/0132025 A1 | 6/2006 | Gao et al. | |
| 2006/0203515 A1 * | 9/2006 | Fujikawa et al. | 362/615 |
| 2007/0159070 A1 * | 7/2007 | Hu | 313/504 |
| 2010/0277855 A1 * | 11/2010 | Lim et al. | 361/679.01 |
| 2011/0273411 A1 | 11/2011 | Seo et al. | |
| 2012/0204453 A1 * | 8/2012 | Jung | 40/517 |
| 2013/0034685 A1 | 2/2013 | An et al. | |
| 2013/0081756 A1 | 4/2013 | Franklin et al. | |
| 2014/0043734 A1 * | 2/2014 | Kim et al. | 361/679.01 |
| 2014/0049449 A1 * | 2/2014 | Park et al. | 345/1.3 |
| 2014/0065393 A1 * | 3/2014 | Lee et al. | 428/216 |
| 2014/0110726 A1 * | 4/2014 | Naijo | 257/88 |
| 2014/0117844 A1 * | 5/2014 | Naijo | 313/511 |
| 2014/0145161 A1 * | 5/2014 | Naijo | 257/40 |

(Continued)

FOREIGN PATENT DOCUMENTS

JP 08-203669 A 8/1996
KR 10-2006-0122601 A 11/2006

(Continued)

*Primary Examiner* — Laura Menz
(74) *Attorney, Agent, or Firm* — Robert E. Bushnell, Esq.

(57) ABSTRACT

The present invention relates to an organic light emitting diode display, and in order to improve luminance, the organic light emitting diode display includes a flexible substrate bent at least one time, a first display unit positioned on the flexible substrate and including a plurality of first light emitting diodes, and a second display unit positioned on the flexible substrate and including a plurality of second light emitting diodes, in which a width of each second light emitting diode is larger than the width of each first light emitting diode.

13 Claims, 7 Drawing Sheets

(56) References Cited

U.S. PATENT DOCUMENTS

2014/0264299 A1* 9/2014 Naijo ............................. 257/40
2015/0041766 A1* 2/2015 Naijo ............................. 257/40

FOREIGN PATENT DOCUMENTS

| KR | 10-2009-0116101 A | 11/2009 |
| KR | 10-2009-0131553 A | 12/2009 |

* cited by examiner

ORGANIC LIGHT EMITTING DIODE DISPLAY

CLAIM OF PRIORITY

This application claims priority to and the benefit of Korean Patent Application No. 10-2013-0094419 filed in the Korean Intellectual Property Office on Aug. 8, 2013, the entire contents of which are incorporated herein by reference.

BACKGROUND OF THE INVENTION

1. Field of the Invention

The present invention relates to an organic light emitting diode display.

2. Description of the Related Art

An organic light emitting diode display is a self-light emitting display device displaying an image by using an organic light emitting diode emitting light. Since the organic light emitting diode display, unlike a liquid crystal display, does not require a separate light source, a thickness and a weight thereof may be relatively reduced. Furthermore, since the organic light emitting diode display has high quality characteristics such as low power consumption, high luminance, and a high reaction speed, the organic light emitting diode display receives attention as a next generation display device of a portable electronic device.

The organic light emitting diode includes two electrodes and a light emitting layer positioned therebetween, electrons injected from one electrode and holes injected from the other electrode are bonded to each other in the light emitting layer to form an exciton, and light is emitted while the exciton discharges energy.

In the organic light emitting diode, it is important to increase light emitting efficiency and improve a life span.

In order to increase the life span of the organic light emitting diode, a structure where charge loading layers, such as the light emitting layer, a hole injection layer, and an electron injection layer, are laminated in plural to increase luminance to a current by 2 to 3 times has been developed.

However, since units formed of a hole loading layer, the light emitting layer, and an electron loading layer should be repeatedly laminated in order to laminate loading layers constituting organic light emitting layers in plural, there is a problem in that a deposition process and costs are increased.

Furthermore, there is a problem in that a light emitting area is reduced due to overlapping of the organic light emitting layers or light emitted from the organic light emitting layers laminated on an upper portion is reflected by the organic light emitting layers laminated on a lower portion to reduce efficiency.

The above information disclosed in this Background section is only for enhancement of an understanding of the background of the invention, and therefore it may contain information that does not form the prior art that is already known in this country to a person of ordinary skill in the art.

SUMMARY OF THE INVENTION

The present invention has been developed in an effort to provide an organic light emitting diode display in which a light emitting region is not reduced even though organic light emitting layers overlap, and in which light emitted from the organic light emitting layers is prevented from being reflected to exhibit excellent luminance.

An exemplary embodiment of the present invention provides an organic light emitting diode display including: a flexible substrate bent at least one time; a first display unit positioned on the flexible substrate and including a plurality of first light emitting diodes; and a second display unit positioned on the flexible substrate and including a plurality of second light emitting diodes, in which a width of the second light emitting diode is larger than the width of the first light emitting diode.

The first light emitting diode and the second light emitting diode may each include a first electrode, a light emitting layer, and a second electrode.

The first electrode of the first light emitting diode may be a transparent layer or a semi-transparent layer, and the first electrode of the second light emitting diode may be a reflective layer.

The second electrode of the first light emitting diode may be the reflective layer, and the second electrode of the second light emitting diode may be the transparent layer or the semi-transparent layer.

The second light emitting diode may further include an absorption layer positioned on the second electrode.

The plurality of second light emitting diodes may be positioned in spaces separated between the plurality of first light emitting diodes.

The widths of the plurality of second light emitting diodes may be larger than the spaces separated between the plurality of first light emitting diodes.

The reflective layer may be formed of at least one metal of magnesium (Mg), silver (Ag), gold (Au), calcium (Ca), lithium (Li), chromium (Cr), and aluminum (Al), or an alloy thereof.

The transparent layer may be formed of at least one material of ITO (indium tin oxide), IZO (indium zinc oxide), ZnO (zinc oxide), and $In_2O_3$ (indium oxide).

The absorption layer may be a coloring pigment or a carbon nanotube.

The flexible substrate may be bent between the first display unit and the second display unit.

The organic light emitting diode display may further include a sealant sealing the first display unit and the second display unit.

The flexible substrate may include at least one of polyimide, polycarbonate, polyacrylate, polyetherimide, polyethersulfone, polyethylene terephthalate, and polyethylene naphthalate.

The first light emitting diode may be a bottom emission type, and the second light emitting diode may be a top emission type.

According to an exemplary embodiment of the present invention, in the organic light emitting diode display, it is possible to increase luminance of an organic light emitting diode even though a plurality of light emitting units are not laminated, and to reduce a loss in luminance due to overlapping.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
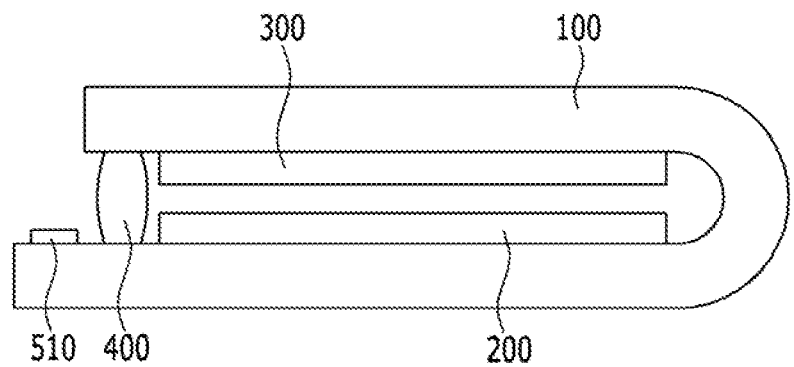
FIG. 1 is a schematic cross-sectional view of an organic light emitting diode display according to an exemplary embodiment of the present invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

In the drawings, the thickness of layers, films, panels, regions, etc. are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an organic light emitting diode display according to an exemplary embodiment of the present invention will be described in detail with reference to the drawings.

Figure 2:
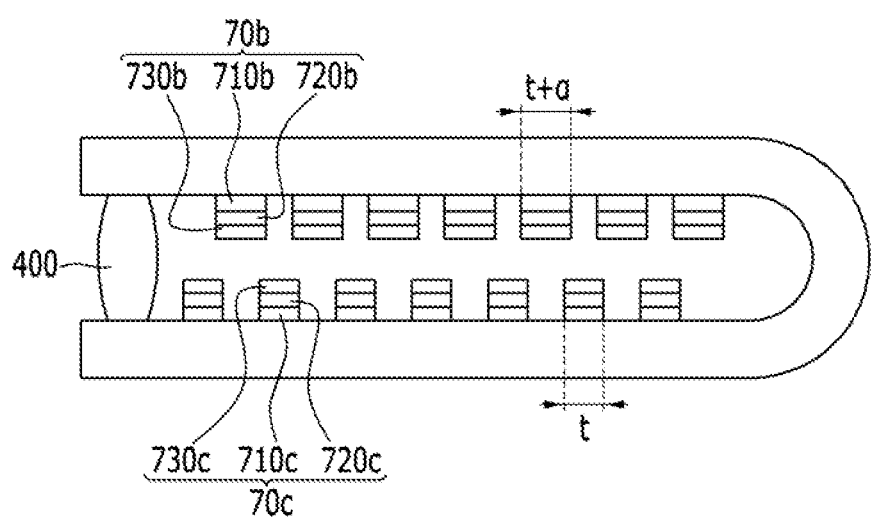
FIG. 2 is a schematic top plan view of the organic light emitting diode display of FIG. 1.
Figure 3:
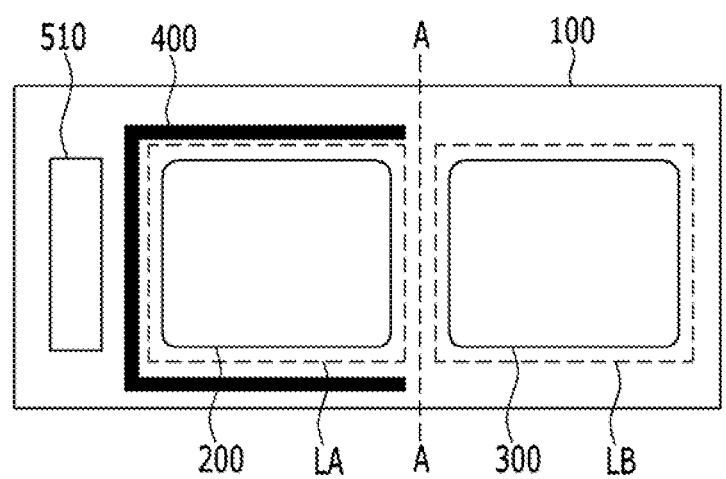
FIG. 3 is a cross-sectional view of the organic light emitting diode display according to the exemplary embodiment of the present invention.
Figure 4:
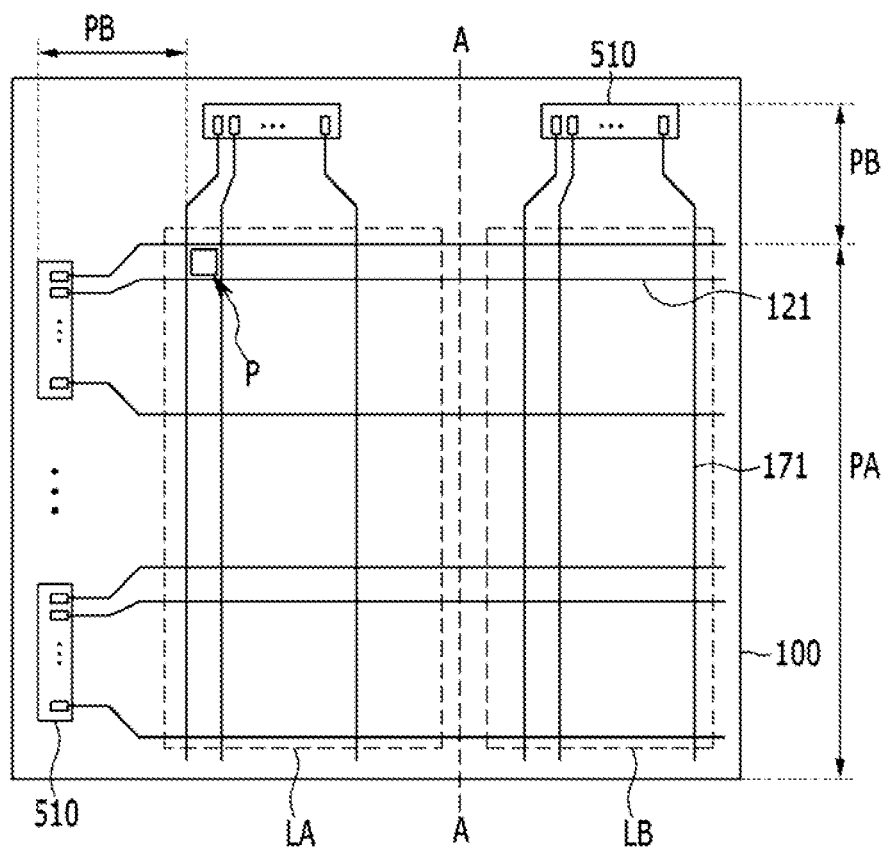
FIG. 4 is a layout view of a signal line of a display unit of the organic light emitting diode display according to the exemplary embodiment of the present invention.
Figure 5:
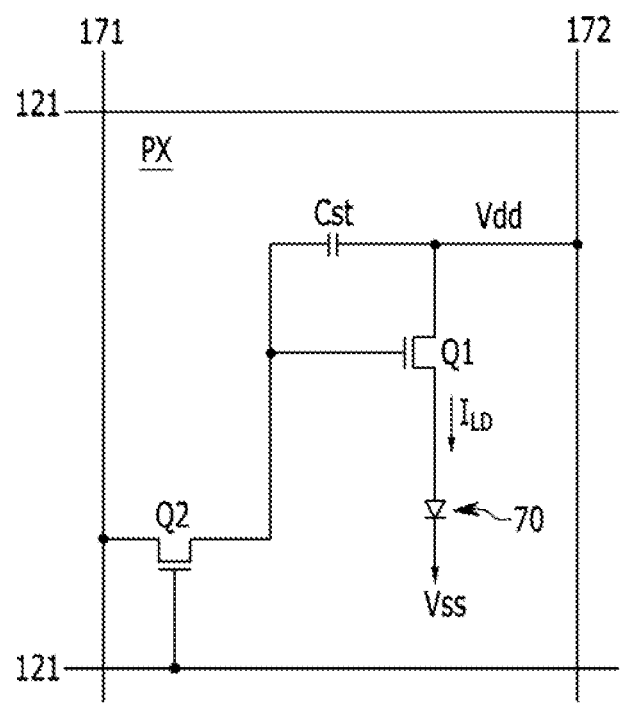
FIG. 5 is an equivalent circuit diagram of one pixel of the display unit according to the exemplary embodiment of the present invention.
Figure 6:
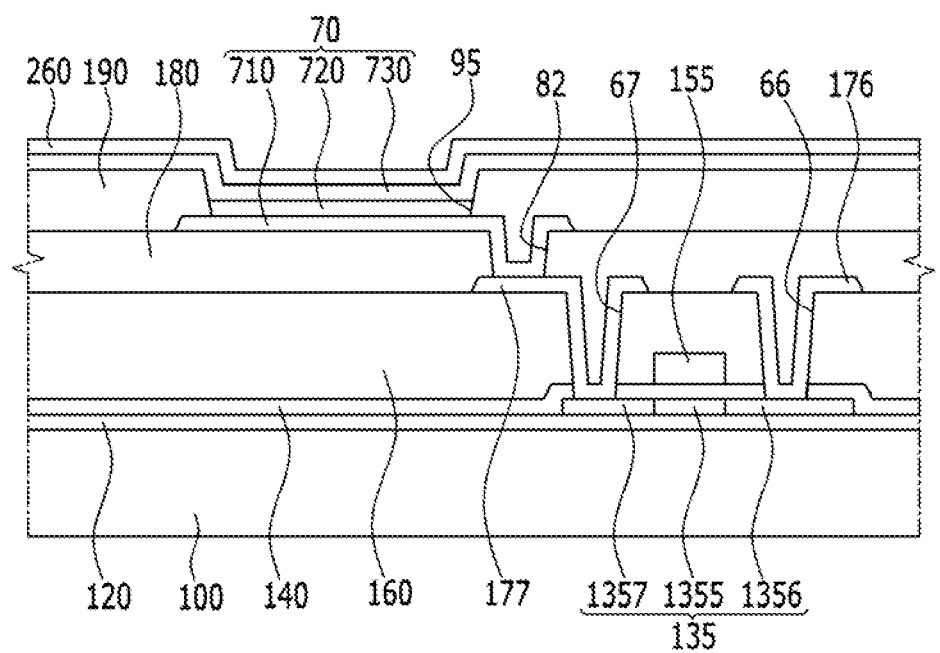
FIG. 6 is a cross-sectional view of one pixel of the organic light emitting diode display of FIG. 5.

FIG. 1 is a schematic cross-sectional view of an organic light emitting diode display according to an exemplary embodiment of the present invention, FIG. 2 is a schematic top plan view of the organic light emitting diode display of FIG. 1, FIG. 3 is a cross-sectional view of the organic light emitting diode display according to the exemplary embodiment of the present invention, FIG. 4 is a layout view of a signal line of a display unit of the organic light emitting diode display according to the exemplary embodiment of the present invention, FIG. 5 is an equivalent circuit diagram of one pixel of the display unit according to the exemplary embodiment of the present invention, and FIG. 6 is a cross-sectional view of one pixel of the organic light emitting diode display of FIG. 5.

As illustrated in FIGS. 1 to 3, a flexible display device 1000 according to the exemplary embodiment of the present invention includes a substrate 100, and a first display unit 200 and a second display unit 300 including a plurality of pixels formed on the substrate 100. Each pixel of the first display unit 200 includes a plurality of first light emitting diodes, and each pixel of the second display unit 300 includes a plurality of second light emitting diodes.

The substrate 100 is a flexible substrate and may be formed of an organic material selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP) that are an insulating organic material.

A sealant 400 is formed between edge portions of the flexible substrate 100, and a first display region LA and a second display region LB of the folded substrate 100 are bonded to be sealed.

The sealant 400 is positioned at an edge of the substrate 100 with the exception of a portion A at which the substrate 100 is folded, and is formed along a boundary line of the first display region LA or the second display region LB so as to surround the first display region LA or the second display region LB (see FIGS. 3 and 4).

The sealant 400 may be a thermosetting or photo-curable adhesive, and a glass frit may be used.

In the latter regard, if the first display unit 200 and the second display unit 300 are formed and the substrate is folded so that the first display unit 200 and the second display unit 300 face each other based on the folding region A so as to form the organic light emitting diode display, luminance of the organic light emitting diode display may be increased.

Particularly, according to the exemplary embodiment of the present invention, in the case where the first display unit 200 and the second display unit 300 face each other, a loss in luminance due to overlapping of the light emitting diodes may be reduced so as to exhibit the improved luminance.

To be more specific, the organic light emitting diode display according to the exemplary embodiment of the present invention will be described with reference to FIG. 3.

First, the first display unit 200 positioned on the flexible substrate and including the plurality of first light emitting diodes will be reviewed. According to the exemplary embodiment of the present invention, the first light emitting diode is a bottom emission type including a first electrode, a light emitting layer, and a second electrode, in which a first electrode 710 is a transparent layer or a semi-transparent layer, and a second electrode 730 is a reflective layer (see FIG. 6).

Next, the second display unit positioned on the flexible substrate and including the plurality of second light emitting diodes will be described. According to the exemplary embodiment of the present invention, the second light emitting diode is a top emission type including a first electrode, a light emitting layer, and a second electrode, in which the first electrode is the reflective layer, and the second electrode is the transparent layer or the semi-transparent layer.

Figure 7:
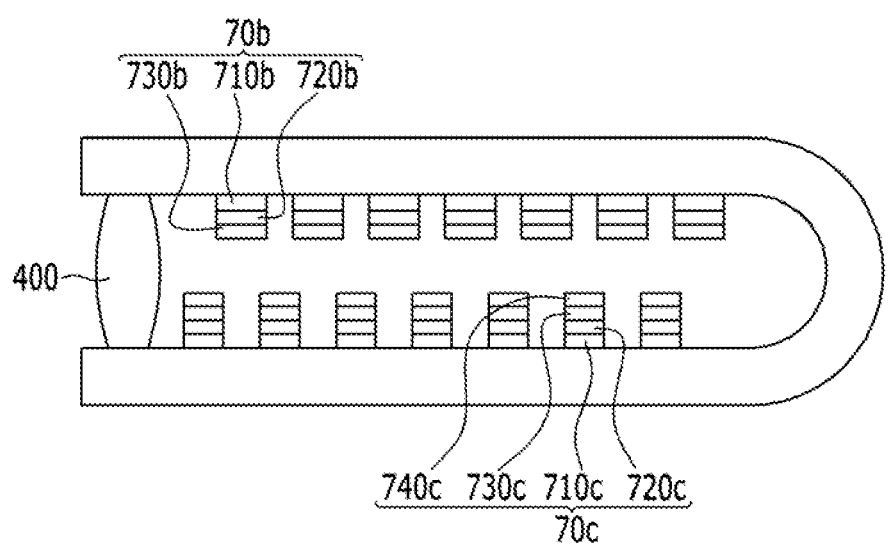
FIG. 7 is a cross-sectional view of an organic light emitting diode display according to another exemplary embodiment of the present invention.

In the flexible substrate 100 that is folded at least one time as illustrated in FIG. 1, a plurality of first light emitting diodes 70b and a plurality of second light emitting diodes 70c face each other (see FIG. 7).

In this case, the plurality of second light emitting diodes 70c according to the exemplary embodiment of the present invention is positioned in spaces separated between the plurality of first light emitting diodes 70b, which is for increasing the luminance.

Furthermore, a width t+α of the plurality of second light emitting diodes 70c is larger than a width t of the plurality of first light emitting diodes 70b or an interval between the adjacent first light emitting diodes 70b. The reason is because, in the case where the width of the second light emitting diode 70c is larger than the width of the first light emitting diode 70b or an interval between the adjacent first light emitting diodes, even though the first light emitting diode 70b and the second light emitting diode 70c overlap with each other, light can be totally emitted to the interval between the first light emitting diodes 70b, and thus there is no loss in luminance.

Referring to FIG. 3, the substrate 100 includes the first display region LA and the second display region LB positioned on the same surface, and the first display unit 200 is positioned in the first display region LA, and the second display unit 300 is positioned in the second display region LB. The substrate 100 is folded at least one time, and thus the first display unit 200 and the second display unit 300 face each other.

The pixels of the first display unit 200 and the second display unit 300 form a matrix, and are connected to a plurality of signal lines.

Referring to FIG. 4, a first signal line 121 extending in one direction to transfer a scan signal, and a second signal line 171 crossing the first signal line 121 to transfer an image signal are formed on the first display region LA and the second display region LB of the substrate 100. The first signal line 121 and the second signal line 171 are connected to each pixel, and the pixel may be connected to various signal lines (not illustrated), to which the other signal is applied, other than the first signal line 121 and the second signal line 171.

A driver 510 positioned in a peripheral region PB outside the first display region LA and the second display region LB, and controlling a thin film transistor of the pixel, is positioned on the substrate 100.

The driver 510 may be mounted as an IC chip on the substrate 100, or it may be integrated together with the thin film transistors of the first display region LA and the second display region LB on the substrate. In this case, the first signal line 121 connected to the driver 510 may be positioned so as to be connected to the first display region LA and the second display region LB, thus crossing the folding region A positioned between the first display region LA and the second display region LB.

Meanwhile, the organic light emitting diode display of FIGS. 1 to 4 includes the plurality of pixels, each including an equivalent circuit illustrated in FIG. 5.

Referring to FIG. 5, the organic light emitting diode display according to the exemplary embodiment of the present invention includes the plurality of signal lines 121 and 171, and the plurality of pixels PX connected thereto and arranged in an approximate matrix form.

The signal lines include a plurality of first signal lines 121 transferring a gate signal (or a scan signal), a plurality of second signal lines 171 transferring a data signal, and a plurality of third signal lines 172 transferring a driving voltage Vdd. The first signal lines 121 extend in an approximate row direction and are almost parallel to each other, and the second signal lines 171 and the third signal lines 172 cross the first signal lines 121 so as to extend in a column direction and are almost parallel to each other.

Each pixel PX includes a switching thin film transistor Q2, a driving thin film transistor Q1, a storage capacitor Cst, and an organic light emitting diode (OLED) 70.

The switching thin film transistor Q2 has a control terminal, an input terminal, and an output terminal, in which the control terminal is connected to the first signal line 121, the input terminal is connected to the second signal line 171, and the output terminal is connected to the driving thin film transistor Q1. The switching thin film transistor Q2 responds to the scan signal applied to the first signal line 121 so as to transfer the data signal applied to the second signal line 171 to the driving thin film transistor Q1.

Furthermore, the driving thin film transistor Q1 also has a control terminal, an input terminal, and an output terminal, in which the control terminal is connected to the switching thin film transistor Q2, the input terminal is connected to the third signal line 172, and the output terminal is connected to the organic light emitting diode 70. The driving thin film transistor Q1 flows an output current $I_{LD}$ having a magnitude varying according to a voltage applied between the control terminal and the output terminal.

The capacitor Cst is connected between the control terminal and the input terminal of the driving thin film transistor Q1. The capacitor Cst charges the data signal applied to the control terminal of the driving thin film transistor Q1 and maintains the data signal even after the switching thin film transistor Q2 is turned-off.

The organic light emitting diode 70 has an anode connected to the output terminal of the driving thin film transistor Q1, and a cathode connected to a common voltage Vss. The organic light emitting diode 70 displays an image by emitting light while changing the intensity according to the output current $I_{LD}$ of the driving thin film transistor Q1.

FIG. 6 is a cross-sectional view of one pixel of the organic light emitting diode display of FIG. 5. In FIG. 6, the second thin film transistor Q2 and the organic light emitting diode 70 of FIG. 5 will be mainly described in detail according to the order of lamination. Hereinafter, the second thin film transistor Q2 will be called a thin film transistor.

As illustrated in FIG. 6, the organic light emitting diode display includes the substrate 100, and a buffer layer 120 is formed on the substrate 100.

The buffer layer 120 may be formed so as to have a single layer structure of silicon nitride (SiNx) or a dual-layer structure in which silicon nitride (SiNx) and silicon oxide ($SiO_2$) are laminated. The buffer layer 120 serves to prevent unnecessary components such as an impurity or moisture from permeating and planarizing a surface.

A semiconductor 135 formed of polysilicon is formed on the buffer layer 120.

The semiconductor 135 is divided into a channel region 1355, and a source region 1356 and a drain region 1357 formed at both sides of the channel region 1355, respectively. The channel region 1355 of the semiconductor 135 is polysilicon not doped with an impurity, that is, an intrinsic semiconductor. The source region 1356 and the drain region 1357 are polysilicon doped with a conductive impurity, that is, an impurity semiconductor. The impurity doped on the source region 1356 and the drain region 1357 may be any one of a p-type impurity and an n-type impurity.

A gate insulating layer 140 is formed on the semiconductor 135. The gate insulating layer 140 may be a single layer or a plurality of layers, including at least one of tetraethoxysilane (tetraethyl orthosilicate, TEOS), silicon nitride, and silicon oxide.

A gate electrode 155 is formed on the semiconductor 135, and the gate electrode 155 overlaps with the channel region 1355.

The gate electrode 155 may be formed of a single layer or a plurality of layers of a low resistance material such as Al, Ti, Mo, Cu, Ni, or an alloy thereof, or a material having strong corrosion.

A first interlayer insulating layer 160 is formed on the gate electrode 155. The first interlayer insulating layer 160, like the gate insulating layer 140, may be formed of a single layer or a plurality of layers of tetraethoxysilane (tetraethyl orthosilicate, TEOS), silicon nitride, or silicon oxide.

The first interlayer insulating layer 160 and the gate insulating layer 140 have a source contact hole 66 and a drain contact hole 67 through which the source region 1356 and the drain region 1357 are exposed, respectively.

A source electrode 176 and a drain electrode 177 are formed on the first interlayer insulating layer 160. The source electrode 176 is connected to the source region 1356 through the contact hole 66, and the drain electrode 177 is connected to the drain region 1357 through the contact hole 67.

The source electrode 176 and the drain electrode 177 may be formed of a single layer or a plurality of layers of a low resistance material such as Al, Ti, Mo, Cu, Ni, or an alloy thereof, or the material having strong corrosion. For example, the source electrode 176 and the drain electrode 177 may be a triple layer of Ti/Cu/Ti, Ti/Ag/Ti, or Mo/Al/Mo.

The gate electrode 155, the source electrode 176, and the drain electrode 177 are a control electrode, an input electrode, and an output electrode, respectively, of FIG. 1, and form a thin film transistor together with the semiconductor 135. A channel of the thin film transistor is formed in the semiconductor 135 between the source electrode 176 and the drain electrode 177.

A second interlayer insulating layer 180 is formed on the source electrode 176 and the drain electrode 177. The second interlayer insulating layer 180 includes a contact hole 82 through which the drain electrode 177 is exposed.

The second interlayer insulating layer 180 may be formed of a single layer or a plurality of layers of tetraethoxysilane (tetraethyl orthosilicate, TEOS), silicon nitride, or silicon oxide like the first interlayer insulating layer, and may be formed of a low permittivity organic material.

The first electrode 710 is formed on the second interlayer insulating layer 180. The first electrode 710 is electrically connected to the drain electrode 177 through the contact hole 82, and the first electrode 710 may be the anode of the organic light emitting diode of FIG. 1.

In one exemplary embodiment of the present invention, the second interlayer insulating layer 180 is formed between the first electrode 710 and the drain electrode 177, but the first electrode 710 may be formed on the same layer as the drain electrode 177, and may be integrated with the drain electrode 177.

A pixel defining layer 190 is positioned on the first electrode 710. The pixel defining layer 190 has an opening 95 through which the first electrode 710 is exposed. The pixel defining film 190 may be formed to include resins such as polyacrylates or polyimides, and silica-based inorganic materials.

An organic light emitting layer 720 is formed in the opening 95 of the pixel defining layer 190.

The organic light emitting layer 720 is formed of multilayers including one or more of a light emitting layer, a hole injection layer (HIL), a hole transporting layer (HTL), an electron transporting layer (ETL), and an electron injection layer (EIL).

In the case where the organic light emitting layer 720 includes all of the layers, the hole injection layer may be positioned on the pixel electrode 710 that is the anode, and the hole transporting layer, the light emitting layer, the electron transporting layer, and the electron injection layer may be sequentially laminated thereon.

In this case, the light emitting layer may be formed of a low molecular organic material or a high molecular organic material such as PEDOT (poly 3,4-ethylenedioxythiophene). The light emitting layer may include a red light emitting layer emitting red light, a green light emitting layer emitting green light, and a blue light emitting layer emitting blue light, and the red light emitting layer, the green light emitting layer, and the blue light emitting layer are respectively formed in a red pixel, a green pixel, and a blue pixel to implement a color image.

Furthermore, the light emitting layer may implement the color image by laminating all of the red light emitting layer, the green light emitting layer, and the blue light emitting layer in the red pixel, the green pixel, and the blue pixel together, and by forming a red color filter, a green color filter, and a blue color filter for each pixel. In another example, a white light emitting layer emitting white light may be formed in all of the red pixel, the green pixel, and the blue pixel, and the red color filter, the green color filter, and the blue color filter may be formed for each pixel to implement the color image. In the case where the color image is implemented by using the white light emitting layer and the color filter, a deposition mask for depositing the red light emitting layer, the green light emitting layer, and the light emitting layer on each pixel, that is, the red pixel, the green pixel, and the blue pixel, may not be used.

Furthermore, of course, the white light emitting layer may be formed of one light emitting layer emitting white light, or may emit white light by laminating a plurality of light emitting layers emitting lights having different colors. For example, a constitution where white light can be emitted by combining at least one yellow light emitting layer and at least one blue light emitting layer, a constitution where white light can be emitted by combining at least one cyan light emitting layer and at least one red light emitting layer, a constitution where white light can be emitted by combining at least one magenta light emitting layer and at least one green light emitting layer, and the like may be included.

The second electrode 730 is formed on the pixel defining layer 190 and the organic light emitting layer 720.

The second electrode 730 becomes a cathode of the organic light emitting diode. Accordingly, the first electrode 710, the organic light emitting layer 720, and the second electrode 730 form the organic light emitting diode 70.

The organic light emitting diode display may have any one structure of a top display type, a bottom display type, and a double-sided display type according to a direction of light emitted by the organic light emitting diode 70.

In the case of the top display type, the first electrode 710 is formed of the reflective layer, and the second electrode 730 is formed of the semi-transparent layer or the transparent layer. On the other hand, in the case of the bottom display type, the first electrode 710 is formed of the semi-transparent layer or the transparent layer, and the second electrode 730 is formed of the reflective layer. In addition, in the case of the double-sided display type, the first electrode 710 and the second electrode 730 are formed of the transparent layer or the semi-transparent layer.

The reflective layer and the semi-transparent layer are made by using one or more metals of magnesium (Mg), silver (Ag), gold (Au), calcium (Ca), lithium (Li), chromium (Cr), and aluminum (Al), or an alloy thereof. The reflective layer and the semi-transparent layer are determined by a thickness, and the semi-transparent layer may be formed so as to have a thickness of 200 nm or less. Transmittance of light is increased as the thickness is reduced, but if the thickness is very small, resistance is increased.

The transparent layer is formed of a material such as ITO (indium tin oxide), IZO (indium zinc oxide), ZnO (zinc oxide), or $In_2O_3$ (indium oxide).

In the exemplary embodiment of the present invention, the first light emitting diode of the first display unit is a bottom display type, and the second light emitting diode of the second display unit is a top display type.

That is, the first light emitting diode of the first display unit includes the first electrode formed of the transparent layer or the semi-transparent layer and the second electrode formed of the reflective layer, and the second light emitting diode of the second display unit includes the first electrode formed of the reflective layer and the second electrode formed of the transparent layer or the semi-transparent layer.

In the exemplary embodiment of the present invention, only the case where the first light emitting diode of the first display unit is the bottom display type and the second light emitting diode of the second display unit is the top display type is illustrated, but the present invention is not limited thereto. That is, the first light emitting diode of the first display unit may be the top display type and the second light emitting diode of the second display unit may be the bottom display type. According to this case, the first light emitting diode of the first display unit may include the first electrode formed of the reflective layer and the second electrode formed of the transparent layer or the semi-transparent layer, and the second light emitting diode of the second display unit may include the first electrode formed of the transparent layer or the semi-transparent layer and the second electrode formed of the reflective layer.

Next, an encapsulation 260 is formed on the second electrode 730.

The encapsulation 260 may be formed by alternately laminating one or more organic layers and one or more inorganic layers. The inorganic layer or the organic layer may be each provided in plural.

The organic layer is formed of a polymer, and preferably, may be a single layer or a laminated layer formed of any one of polyethylene terephthalate, polyimide, polycarbonate, epoxy, polyethylene, and polyacrylate. More preferably, the organic layer may be formed of polyacrylate, and specifically, includes a substance obtained by polymerizing a monomer composition including a diacrylate-based monomer and a triacrylate-based monomer. A monoacrylate-based monomer may be further included in the monomer composition. Furthermore, a known photoinitiator such as TPO may be further included in the monomer composition, but the present invention is not limited thereto.

The inorganic layer may be a single layer or a laminated layer including metal oxide or metal nitride. Specifically, the inorganic layer may include any one of $SiN_x$, $Al_2O_3$, $SiO_2$, and $TiO_2$.

The uppermost layer of the sealing layer, which is exposed to the outside, may be formed of the inorganic layer in order to prevent permeation of moisture to the organic light emitting diode.

The sealing layer may include at least one sandwich structure in which at least one organic layer is inserted between at least two inorganic layers. Furthermore, the sealing layer may include at least one sandwich structure in which at least one inorganic layer is inserted between at least two organic layers.

The sealing layer may sequentially include a first inorganic layer, a first organic layer, and a second inorganic layer from an upper portion of the display unit. Furthermore, the sealing layer may sequentially include the first inorganic layer, the first organic layer, the second inorganic layer, a second organic layer, and a third inorganic layer from the upper portion of the display unit. Furthermore, the sealing layer may sequentially include the first inorganic layer, the first organic layer, the second inorganic layer, the second organic layer, the third inorganic layer, a third organic layer, and a fourth inorganic layer from the upper portion of the display unit.

A halogenated metal layer including LiF may be further included between the display unit and the first inorganic layer. The halogenated metal layer may prevent the display unit from being damaged when the first inorganic layer is formed by sputtering or plasma deposition.

The first organic layer has an area that is smaller than that of the second inorganic layer, and the second organic layer may have an area that is smaller than that of the third inorganic layer. Furthermore, the first organic layer is completely covered by the second inorganic layer, and second organic layer may be completely covered by the third inorganic layer.

FIG. 7 is a cross-sectional view of an organic light emitting diode display according to another exemplary embodiment of the present invention. Since a large portion of the organic light emitting diode display according to this exemplary embodiment of the present invention has the same constituent elements as that of the aforementioned organic light emitting diode display, only different constituent elements will be described.

A first light emitting diode of a first display unit of the organic light emitting diode display according to another exemplary embodiment of the present invention further includes an absorption layer 740c positioned on a second electrode 730c (see FIG. 7).

The second electrode of the first display unit according to the exemplary embodiment of the present invention is the reflective layer, and thus light emitted from the light emitting diode of the second display unit may be reflected by the reflective layer. In this case, there is a concern regarding a loss of emitted light, and thus, in the case where the second electrode of the first display unit is the reflective layer, the absorption layer 740 positioned thereon may be further included.

The absorption layer 740 may be made of a material such as a coloring pigment or a carbon nanotube, but the material is not limited thereto, and any material absorbing emitted light is feasible.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
   a flexible substrate bent at least one time so as to form first and second inner surfaces facing each other;
   a first display unit positioned on the first inner surface of the flexible substrate and including a plurality of first light emitting diodes; and
   a second display unit positioned on the second inner surface of the flexible substrate and including a plurality of second light emitting diodes,
   wherein a width of each second light emitting diode is larger than a width of each first light emitting diode.

2. The organic light emitting diode display of claim 1, wherein:
   each first light emitting diode and each second light emitting diode include a first electrode, a light emitting layer, and a second electrode.

3. The organic light emitting diode display of claim 2, wherein:
   the first electrode of said each first light emitting diode is one of a transparent layer and a semi-transparent layer, and said each first electrode of the second light emitting diode is a reflective layer.

4. The organic light emitting diode display of claim 3, wherein:
   the second electrode of said each first light emitting diode is a reflective layer, and the second electrode of said each second light emitting diode is one of a transparent layer and a semi-transparent layer.

5. The organic light emitting diode display of claim 2, wherein:
   said each second light emitting diode further includes an absorption layer positioned on the second electrode.

6. The organic light emitting diode display of claim 5, wherein:

the absorption layer is one of a coloring pigment and a carbon nanotube.

7. The organic light emitting diode display of claim 2, wherein:
the reflective layer is formed of at least one of magnesium (Mg), silver (Ag), gold (Au), calcium (Ca), lithium (Li), chromium (Cr), and aluminum (Al), and an alloy thereof.

8. The organic light emitting diode display of claim 2, wherein:
the transparent layer is formed of at least one of ITO (indium tin oxide), IZO (indium zinc oxide), ZnO (zinc oxide), and $In_2O_3$ (indium oxide).

9. The organic light emitting diode display of claim 1, wherein:
each second light emitting diode is positioned on a portion of the second inner surface which faces a space on the first inner surface which separates two adjacent first light emitting diodes.

10. The organic light emitting diode display of claim 9, wherein:
a width of said each second light emitting diode is larger than the spaces which separate adjacent first light emitting diodes.

11. The organic light emitting diode display of claim 1, further comprising:
a sealant sealing the first display unit and the second display unit.

12. The organic light emitting diode display of claim 1, wherein:
the flexible substrate includes at least one of polyimide, polycarbonate, polyacrylate, polyetherimide, polyethersulfone, polyethylene terephthalate, and polyethylene naphthalate.

13. The organic light emitting diode display of claim 1, wherein:
the first light emitting diode is a bottom emission type, and the second light emitting diode is a top emission type.

* * * * *